United States Patent [19]
Schmidt

[11] 3,996,538
[45] Dec. 7, 1976

[54] SINGLE AMPLIFIER NETWORK FOR SIMULATING AN FDNR CIRCUIT

[75] Inventor: Charles E. Schmidt, Woodside, Calif.

[73] Assignee: GTE Automatic Electric Laboratories Incorporated, Northlake, Ill.

[22] Filed: Dec. 24, 1975

[21] Appl. No.: 644,282

[52] U.S. Cl. ............................ 333/80 R; 333/80 T
[51] Int. Cl.² ........................................ H03H 7/44
[58] Field of Search ....................... 333/80 R, 80 T

[56] References Cited
UNITED STATES PATENTS

| | | | |
|---|---|---|---|
| 2,968,773 | 1/1961 | Sandberg | 333/80 T |
| 3,219,952 | 11/1965 | Saraga | 333/80 R |
| 3,831,117 | 8/1974 | Fletcher | 333/80 R |
| 3,895,309 | 7/1975 | Rollett et al. | 333/80 R |

*Primary Examiner*—Harold A. Dixon
*Attorney, Agent, or Firm*—Russell A. Cannon; Leonard R. Cool

[57] ABSTRACT

The series combination of an FDNR and a resistor is simulated across a pair of terminals of a one-port network which includes a single differential input operational amplifier. One terminal of the network is connected through a first resistor and a second resistor to associated first and second differential inputs of the amplifier. The output of the amplifier is connected through a third resistor to the first input of the amplifier, through the series combination of a first capacitor and a fourth resistor to the second input of the amplifier; and through the series combination of the third resistor and a fifth resistor to the other terminal of the network which is connected to ground. This other terminal is also connected through a second capacitor to the second input of the amplifier. With the capacitances of the capacitors normalized to unity, the product of the normalized resistances of the second and fifth resistors being equal to the product of the normalized resistances of the first and fourth resistors, and the normalized resistances of the third and fifth resistors being the same value, the impedance presented across the one port of the network corresponds to that of an FDNR in series with a resistor.

6 Claims, 2 Drawing Figures

SINGLE AMPLIFIER NETWORK FOR SIMULATING AN FDNR CIRCUIT

BACKGROUND OF INVENTION

This invention relates to simulation networks and more particularly to a network for simulating the series combination of a frequency-dependent negative resistor (FDNR) and a resistor.

In order to provide high-quality filters for use in integrated circuit applications, simulation networks are employed to replace filter inductors with other elements that can be fabricated with integrated circuit techniques. One method of realizing a lowpass inductor-capacitor-resistor (LCR) filter network is to use the concept of frequency-dependent negative resistors (FDNR), which are designated by the parameter D and a symbol represented by four parallel lines. An FDNR is a circuit element defined by its admittance $Y$ which satisfies the relationship $Y(s) = s^2 D$ where $s$ is the complex frequency parameter and $D$ is a real number which may be positive or negative. A prior-art lowpass ladder filter comprises a pair of series inductors connected in series between input and output terminals, an inductor in series with a capacitor and connected between the junction of the series inductors and a ground reference potential, an output capacitor connected between the output terminal and ground, and input and output resistors connected between the input and output terminals, respectively, and ground. The voltage transfer function of this filter is unchanged if the filter is transformed to an equivalent network by multiplying the admittance of every element by the complex frequency parameter $s = j\omega$ so that an inductor becomes a resistor, a resistor becomes a capacitor, and a capacitor becomes an FDNR in the transformed equivalent network in accordance with the technique described in the article "Network Transfer Functions Using the Concept of Frequency-Dependent Negative Resistance" by L. T. Bruton, IEEE Transactions on Circuit Theory, August 1969, pp. 406 – 408. The resultant equivalent network includes an FDNR, the series combination of an FDNR and a resistor, and the parallel combination of an FDNR and a capacitor. Prior-art circuits for simulating an FDNR singularly or in combination with other elements are relatively complex and generally employ two or more amplifiers. Although the structure disclosed in the article, "Parallel Resonator with a Resistance and a Frequency-Dependent Negative Resistance Realized with a Single Operational Amplifier" by Francesco Molo, IEEE Transactions on Circuits and Systems, vol. CAS-21, no. 6, Nov. 1974. pp. 783 – 788, employs only one amplifier, the circuit there has a finite Q in that it cannot be adjusted to provide zero admittance at a particular frequency. The circuit in this article also does not simulate the series combination of an FDNR and a resistor across the network terminals and requires three capacitors in the simulation network as opposed to the usual two capacitors.

An object of this invention is the provision of an improved circuit for realizing the series combination of an FDNR and a resistor.

DESCRIPTION OF DRAWING

This invention will be more fully understood from the following detailed descriptions of preferred embodiments thereof, reference being had to the drawing in which.

DESCRIPTION OF PREFERRED EMBODIMENT

Figure 1:
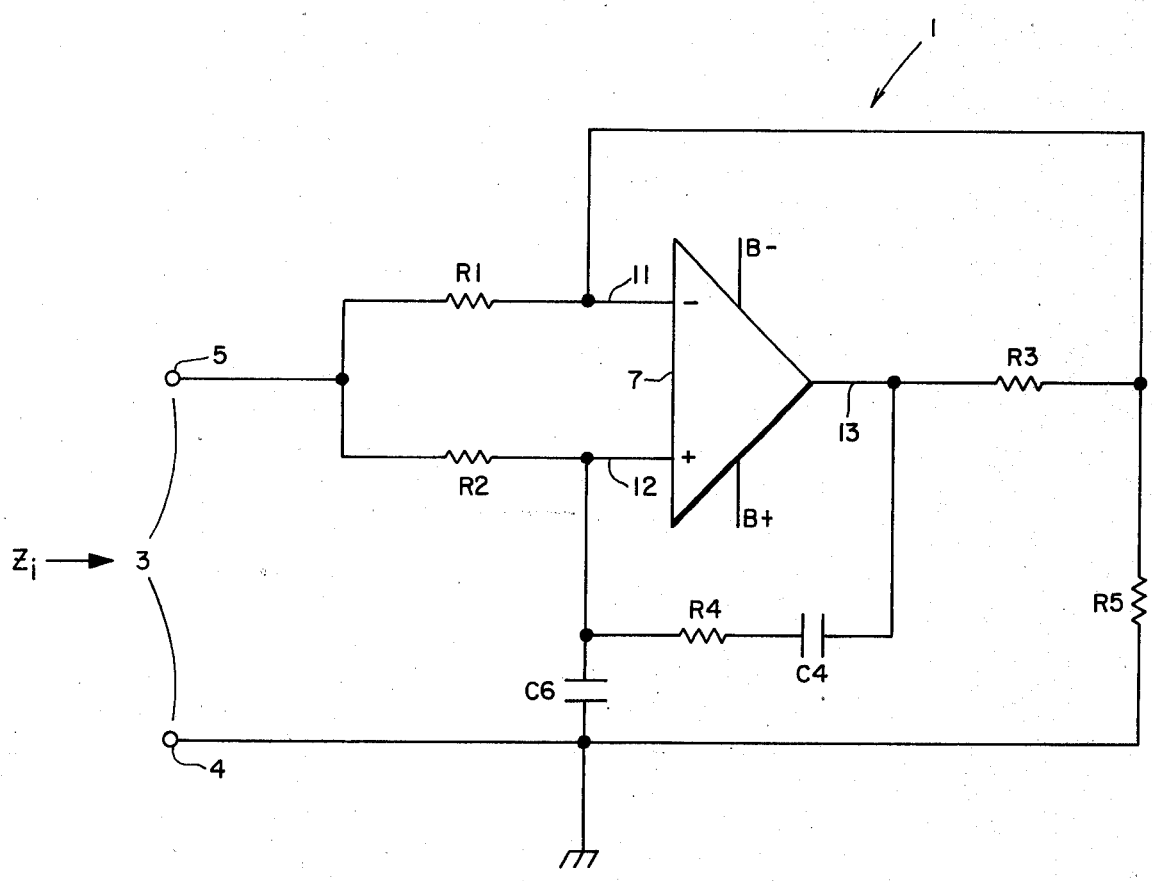
FIG. 1 is a schematic circuit diagram of a simulation network embodying this invention.

The network 1 in FIG. 1 comprises a single port 3 with a pair of terminals 4 and 5, a single amplifier 7, a pair of capacitors C4 and C6, and a plurality of resistors R1 – R5, inclusive. The same reference characters (e.g., R5) are employed in this description to designate both the element and the element value (e.g., the resistance thereof). The context in which a reference character is employed clearly indicates what it designates.

The amplifier 7 is a differential-input operational amplifier. This amplifier is considered in the following description to be an ideal amplifier with zero output impedance, infinite input impedance, and infinite voltage gain. Although such an ideal amplifier does not exist in practice, this does not seriously affect the operation of the network 1. A non-ideal amplifier 7 merely introduces extraneous terms in the impedance $Z_i$ simulated across the network terminals 4 and 5 which can be compensated for, in a manner well known in the art, in order to produce the desired impedance across port 3.

One of the network terminals 4 is connected to a ground reference potential. The input lines 11 and 12 to amplifier 7 are electrically connected through first and second resistors R1 and R2, respectively, to the other network terminal 5. The lines 11 and 12 are preferably connected to the positive and negative inputs, respectively, of amplifier 7 in order to ensure that the nework is DC stable. This is accomplished by making the negative feedback of the network greater than the positive feedback there in a manner well known in the art. This connection may also be affected by whatever resistance path is connected across the terminals 4 and 5. Terminals of the amplifier are also connected to a supply voltage in a manner well known in the art. The output terminal 13 of the amplifier is connected through the third resistor R3 to the input line 11, through the series combination of the capacitor C4 and the fourth resistor R4 to the other input line 12, and through the series combination of the third resistor R3 and fifth resistor R5 to the ground reference potential. The input line 12 to the amplifier is also electrically connected through capacitor C6 to ground.

Consider that the values of capacitance and resistance of associated elements in the network are normalized and expressed in farads and ohms, respectively. Solving the node equations for this network, and requiring that the resistances of the elements thereof satisfy the relationships $$R3 = R5 \tag{1}$$

and $$R2\ R5 = R1\ R4, \tag{2}$$

the impedance $Z_i$ looking into port 3 is representable as $$Z_i = R + \frac{1}{Ds^2} \tag{3}$$

$$= \frac{R1\,R2}{R1 + R2} + \frac{R1}{R4(R1 + R2)s^2}. \quad (4)$$

Figure 2:
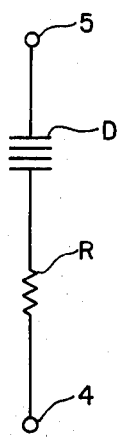
FIG. 2 is a schematic representation of the circuit elements simulated by the network in FIG. 1 across the one port thereof.

This impedance $Z_i$ is shown in FIG. 2 and corresponds to a resistor R and an FDNR D electrically connected in series between the network terminals 4 and 5.

In this network, the resistances R1 - R5 are selected to satisfy the requirements in equations (1) and (2) and the relationships for R and D that are defined by equations (3) and (4). Capacitors C4 and C6 both have normalized capacitances of one fared. In practice, desired values of the simulated resistor R and simulated FDNR D are selected to provide a particular impedance $Z_i$. Normalized values of the resistances R1 - R5 are also selected so as to satisfy equations (1) – (4) for the previously selected values of R and D. Finally, the normalized values of the elements R1 - R5, C4, and C6 are denormalized to values that are physically realizable and convenient for use. By way of example, values of network elements and the realized R and D may be selected to satisfy the relationships $$R1 = R2 = 2R \quad (5)$$

and $$R3 = R4 = R5 = D/2. \quad (6)$$

In a network that was actually built and which operated satisfactorily for is intended purpose, normalized values of the simulated resistor and FDNR were R = 0.4 and D = 0.5 and normalized values of the network elements were $R1, = R2, = 1.25$ ohms and $R3, = R4, = R5 = 4$ ohms. Denormalization was accomplished by choosing a convenient capacitor value ($C = 10^{-8}$ F) and multiplying all capacitors by C and all resistors by $R_0 = 1/(2\pi f\, C_0) = 15.92$ kohms, where $f$ is the desired actual frequency corresponding to 1 radian per second = 1 kHz in the normalized network. In this network, denormalized element values were as follows:

| Elements | Values |
|---|---|
| R1 | 19.89 kohms |
| R2 | 19.89 kohms |
| R3 | 63.66 kohms |
| R4 | 63.66 kohms |
| R5 | 63.66 kohms |
| C4 | 0.01 microfarad |
| C6 | 0.01 microfarad. |

The amplifier 7 in this network was a model 741, manufactured by Fairchild Corporation.

What is claimed is:

1. An active one-port network for simulating an FDNR D and a resistor R electrically connected in series across the pair of terminals of the network port, comprising:

a differential-input operational amplifier having first and second input lines electrically connected to associated input terminals of the amplifier which are of opposite polarity and having an output line;

a first resistor R1 electrically connected between one network terminal and said first input line;

a second resistor R2 electrically connected in series between the one network terminal and said second input line;

a third resistor R3 electrically connected between said output line and said first input line;

a first capacitor C4 and a fourth resistor R4 electrically connected in series between said output line and said second input line;

a fifth resistor R5 electrically connected between said first input line and the other network terminal which is also connected to a ground reference potential; and a second capacitor C6 electrically connected between said second input line and the other network terminal;

normalized values of the capacitances of said capacitors being unity;

normalized values of the the resistances of said resistors satisfying the requirements that $$R3 = R5$$

and $$R2\,R5 = R1\,R4,$$

the impedance $Z_i$ looking into the network port satisfying the relationships $$Z_i = R + \frac{1}{Ds^2}$$

$$= \frac{R1\,R2}{R1 + R2} + \frac{R1}{R4(R1 + R2)s^2}$$

where the symbols D and R represent the values of the FDNR and resistor, respectively, simulated across the network port and which satisfy the relationships $$R = \frac{R1\,R2}{R1 + R2} \text{ and } D = \frac{R4(R1 + R2)}{R1}.$$

2. The simulation network according to claim 1 including only a single differential amplifier.

3. The simulation network according to claim 2 wherein said single amplifier has negative and positive input terminals connected to said first and second input lines, respectively.

4. The simulation network according to claim 3 wherein the resistances of said resistors satisfy the requirements that $R1 = R2 = 2R$ and that $R3 = R4 = R5 = D/2$.

5. The simulation network according to claim 2 including only two capacitors.

6. The simulation network according to claim 5 including only a resistor R1 in the electrical connection of said first input line to the one network terminal.

* * * * *